(12) United States Patent
Kitamura et al.

(10) Patent No.: US 10,290,489 B2
(45) Date of Patent: May 14, 2019

(54) METHOD FOR MANUFACTURING GROUP-III NITRIDE SUBSTRATE AND GROUP-III NITRIDE SUBSTRATE

(71) Applicants: SCIOCS COMPANY LIMITED, Hitachi-shi, Ibaraki (JP); SUMITOMO CHEMICAL COMPANY, LIMITED, Tokyo (JP)

(72) Inventors: Toshio Kitamura, Hitachi (JP); Masatomo Shibata, Hitachi (JP); Takehiro Yoshida, Hitachi (JP)

(73) Assignees: Sciocs Company Limited, Hitachi-shi, Ibaraki (JP); Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 15/789,659

(22) Filed: Oct. 20, 2017

(65) Prior Publication Data

US 2018/0114692 A1 Apr. 26, 2018

(30) Foreign Application Priority Data

Oct. 21, 2016 (JP) .................. 2016-207228

(51) Int. Cl.
| | | |
|---|---|---|
| H01L 21/02 | (2006.01) |
| B23K 26/382 | (2014.01) |
| C30B 25/20 | (2006.01) |
| C30B 29/40 | (2006.01) |
| B23K 26/00 | (2014.01) |
| B23K 26/402 | (2014.01) |

(Continued)

(52) U.S. Cl.
CPC .... H01L 21/02032 (2013.01); B23K 26/0006 (2013.01); B23K 26/352 (2015.10); B23K 26/382 (2015.10); B23K 26/402 (2013.01); C30B 25/20 (2013.01); C30B 29/406 (2013.01); C30B 33/04 (2013.01); B23K 2101/40 (2018.08); H01L 22/12 (2013.01); H01L 22/20 (2013.01)

(58) Field of Classification Search
CPC ................................. H01L 21/02032
See application file for complete search history.

(56) References Cited

U.S. PATENT DOCUMENTS 6,198,367 B1 * 3/2001 Matsunaga ......... H01P 1/20363
333/246
9,765,934 B2 * 9/2017 Rogers .................... H01L 24/52
(Continued)

FOREIGN PATENT DOCUMENTS

JP 2015-199663 A 11/2015

*Primary Examiner* — Thao P Le
(74) *Attorney, Agent, or Firm* — Birch, Stewart, Kolasch & Birch, LLP

(57) ABSTRACT

There is provided a method for manufacturing a group-III nitride substrate, including: (a) preparing a substrate which is made of a group III-nitride crystal and which has a high oxygen concentration domain where an oxygen concentration is higher than that of a matrix of the crystal; (b) irradiating the substrate with laser beam aiming at the high oxygen concentration domain, forming a through-hole penetrating the substrate in a thickness direction, and removing at least a part of the high oxygen concentration domain from the substrate; and (c) embedding at least a part of an inside of the through-hole by growing the group-III nitride crystal in the through-hole.

19 Claims, 10 Drawing Sheets

(51) Int. Cl.
  *B23K 26/352* (2014.01)
  *C30B 33/04* (2006.01)
  *H01L 21/66* (2006.01)
  *B23K 101/40* (2006.01)

(56) References Cited

U.S. PATENT DOCUMENTS

| | | | | |
|---|---|---|---|---|
| 2007/0254455 | A1* | 11/2007 | Yamaguchi | H01L 21/8221 438/455 |
| 2008/0086107 | A1* | 4/2008 | Roschak | A61M 29/02 604/506 |
| 2010/0045919 | A1* | 2/2010 | Chida | H01L 27/1225 349/149 |
| 2014/0225229 | A1* | 8/2014 | Hachigo | H01L 21/76251 257/615 |
| 2015/0194442 | A1* | 7/2015 | Ishibashi | H01L 21/76251 428/137 |

* cited by examiner

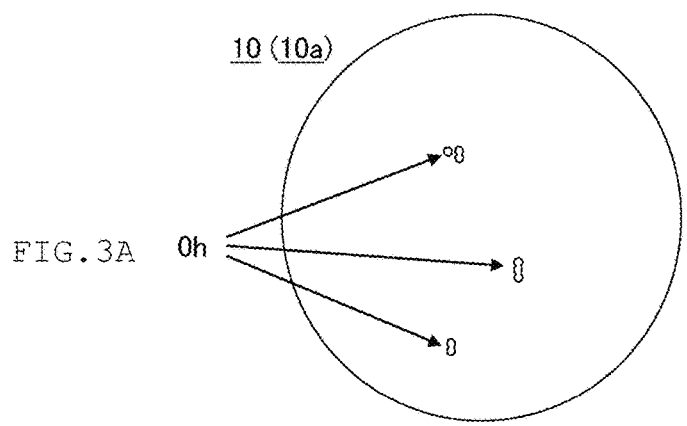
FIG.3A
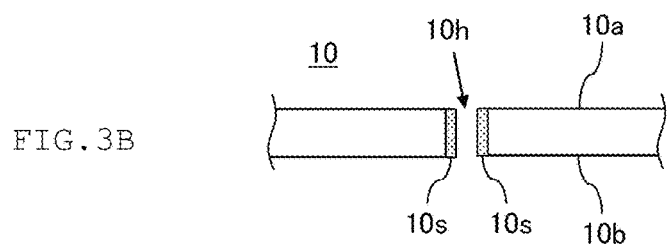
FIG.3B
FIG.3C  FIG.3D  FIG.3E  FIG.3F
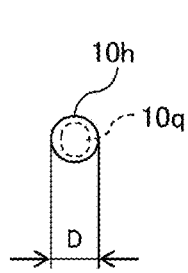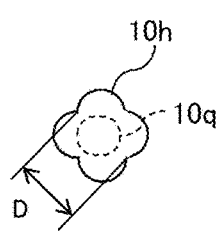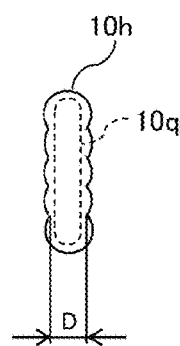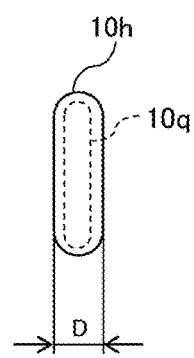

FIG.5A
FIG.5B
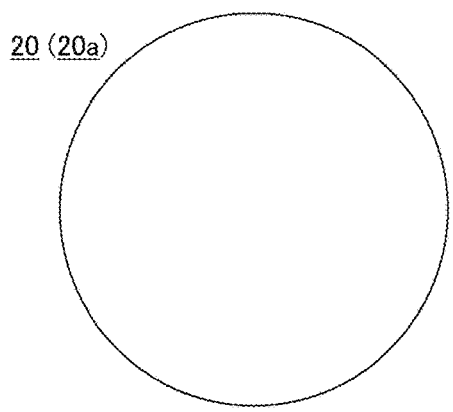
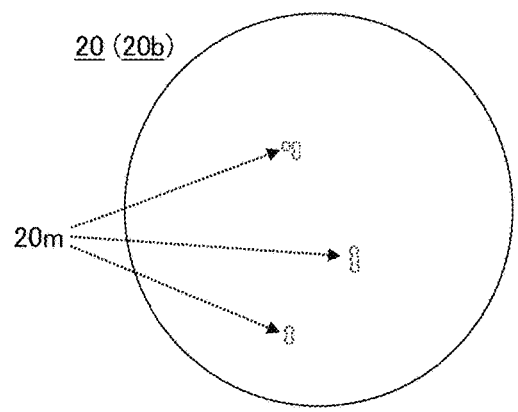
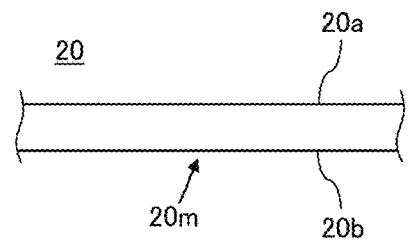
FIG.5C
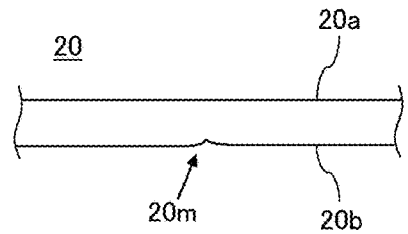
FIG.5D

FIG.6A
FIG.6B
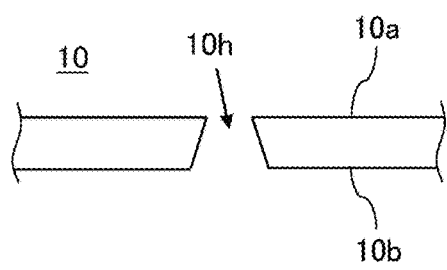
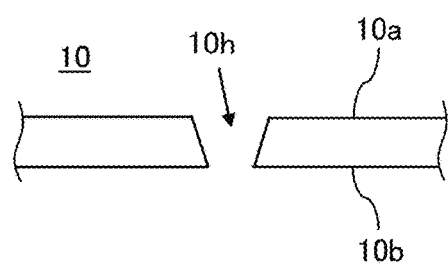
FIG.7A
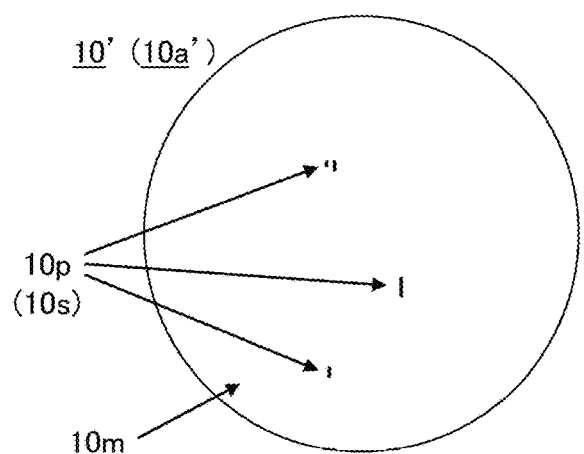
FIG.7B
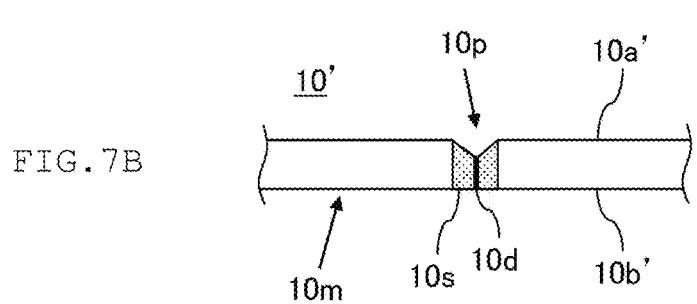

76.7μm×76.7μm (1800 TIMES)

69μm×69μm (2000 TIMES)

METHOD FOR MANUFACTURING GROUP-III NITRIDE SUBSTRATE AND GROUP-III NITRIDE SUBSTRATE

BACKGROUND

Technical Field

The present disclosure relates to a method for manufacturing a group-III nitride substrate and a group-III nitride substrate.

Description of the Related Art

When manufacturing a semiconductor device such as a light-emitting element and a high-speed transistor, for example, a substrate constituted of a group-III nitride crystal such as gallium nitride (GaN) heteroepitaxially grown on a sapphire substrate (also referred to as a group-III nitride substrate, or simply referred to as a substrate hereafter) is prepared, and a processing of further epitaxially growing a crystal on a surface of this substrate is performed in some cases (see patent document 1).

Patent document 1: Japanese Patent Laid Open Publication No. 2015-199663

SUMMARY

A substrate manufactured by the abovementioned method, includes a domain (also referred to as a high oxgen concentration domain hereafter) where an oxygen concentration is higher than that of a matrix of a crystal constituting the substrate. This domain causes a deterioration to occur in a quality of the crystal epitaxially grown on the substrate, and has a factor of deteriorating properties and a yield of the semiconductor device manufactured using this substrate, in some cases. An object of the present dislrosure is to provide a technique capable of improving the quality of a group-III nitride substrate and solving the abovementioned problem.

According to an aspect of the present disclosure, there is provided a method for manufacturing a group-III nitride substrate, including:

(a) preparing a substrate which is made of a group-III nitride crystal and which has a high oxygen concentration domain where an oxygen concentration is higher than that of a matrix of the crystal;

(b) irradiating the substrate with laser beam aiming at the high oxygen concentration domain, forming a through-hole penetrating the substrate in a thickness direction, and removing at least a part of the high oxygen concentration domain from the substrate; and (c) embedding at least a part of an inside of the through-hole by growing the group-III nitride crystal in the through-hole.

According to another aspect of the present disclosure, there is provided a group-III nitride substrate made of a group-III nitride crystal, which does not include a dislocation dense domain and a polarity inversion domain, which a front surface is configured as a flat surface not including a pit, and which has a trace in which a through-hole penetrating a substrate in a thickness direction is embedded with the group-III nitride crystal, on a back surface of the substrate.

According to the present disclosure, the quality of the group-III nitride substrate can be improved.

BRIEF DESCRIPTION OF THE DRAWINGS

FIG. 3A is a planar configuration view of the GaN substrate after performing a perforating step, FIG. 3B is an enlarged partial cross-sectional view thereof, and FIG. 3C to FIG. 3F are respectively enlarged partial surface views of the GaN substrate 10 showing a state in which a part (a broken line) of the high oxygen concentration domain is removed by forming a through-hole 10h (a solid line).

FIG. 5A is a planar configuration view of the GaN substrate 20 after performing the embedding step, FIG. 5B is a back surface configuration view thereof, and FIG. 5C and FIG. 5D are respectively enlarged partial cross-sectional views in the vicinity of the through-hole 10h emebedded with a GaN crystal.

FIG. 6A is an enlarged partial cross-sectional view of the through-hole 10h formed into a circular truncated cone shape, and FIG. 6B is an enlarged partial cross-sectional view of the through-hole 10h formed into an inverted circular truncated cone shape.

FIG. 7A is a planar configuration view of a GaN substrate 10' prepared as a substrate to be processed in a second embodiment, and FIG. 7B is an enlarged partial cross-sectional view thereof.

DETAILED DESCRIPTION OF THE PRESENT DISCLOSURE

<First Embodiment of the Present Disclosure>

Hereafter, a first embodiment of the present disclosure will be described, with reference to the FIG. 1 to FIG. 6.

(1) A Method for Manufacturing a GaN Substrate

In this embodiment, as an example, explanation will be given for a case of manufacturing a GaN substrate 20 as a group-III nitride substrate by performing:

a preparing step of preparing a GaN substrate 10 which is made of a group-III nitride crystal and which has a high oxygen concentration domain (also referred to as a domain 10s hereafter) where an oxygen concentration is higher than that of a matrix of the crystal;

a perforating (drilling) step of irradiating the GaN substrate 10 with laser beam aiming at the domain 10s, forming a through-hole 10h penetrating the GaN substrate 10 in a thickness direction, and removing at least a part of the domain 10s from the GaN substrate 10; and an embedding step of embedding at least a part of an inside of the through-hole 10h by growing the group-III nitride crystal in the through-hole 10h. Explanation of each step will be given hereafter in detail.

(Preparing Step)

Figure 1A:
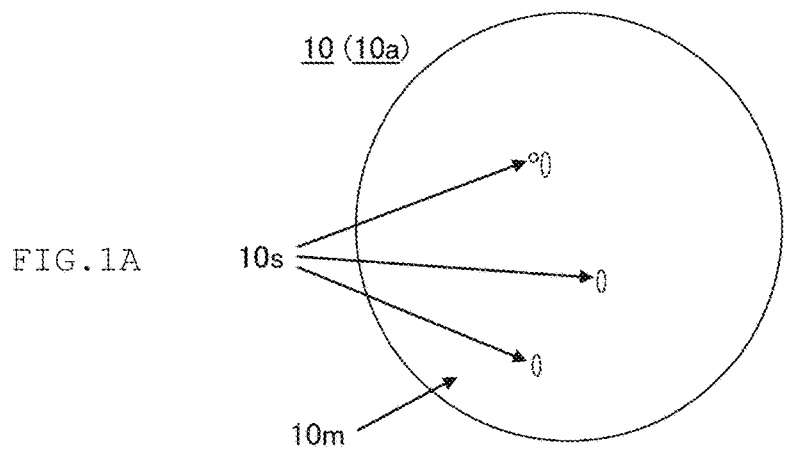
FIG. 1A is a planar configuration view of a GaN substrate 10 prepared as a substrate to be processed in a first embodiment.
Figure 1B:
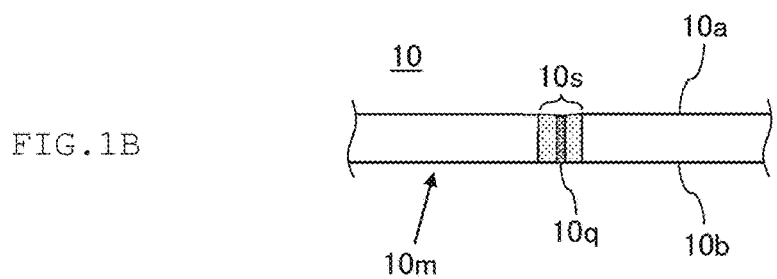
FIG. 1B is an enlarged partial cross-sectional view thereof.

FIG. 1A and FIG. 1B exemplify a planar configuration or cross-sectional configuration of the GaN substrate 10 prepared as a substrate to be processed. The GaN substrate 10 shown here can be manufactured by epitaxially growing a thick GaN crystal on a surface of a base substrate (seed crystal substrate), thereafter slicing the grown crystal ingot so as to be free-standing, for example. In this embodiment, explanation will be given for an example of using a free-standing substrate as the GaN substrate 10, being obtained by slicing an ingot of a GaN crystal which is grown so that a front surface (a growth surface) becomes (0001) plane, namely, Ga-polarity plane (+c-plane).

As described above, the GaN substrate 10 has domains 10s where an oxygen concentration is locally high as compared with a matrix (a mother phase) 10m of a crystal. In many cases, each domain 10s is generated due to temporary or continuous formation of a pit on the growth surface in the process of epitaxially growing the GaN crystal on the base substrate. The term of "pit" means a portion recessed from a circumference of the pit on a surface of the crystal, namely, a dent. An inner surface of the pit is constituted by combining a plurality of facet planes (inclined planes other than the c-plane), and formed into an inverted polygonal pyramid shape (a mortar shape). Each facet plane constituting the inner surface of the pit has a property of easily taking-in oxygen as compared with the growth surface (+c-plane) on an outer side of the pit. Due to this property, the domain 10s where the oxygen concentration is locally high, appears in the GaN substrate 10. According to intensive research by inventors, it is found that a shape in planar view of the domain 10s (a shape of the domain 10s when the GaN substrate 10 is observed from a front surface side) is a hexagonal shape or a dodecagonal shape in many cases.

As the reason why the pit is formed on the growth surface, an influence of foreign materials (particles) attached on the base substrate can be considered. Particles attached on the base substrate acts so as to interfere with adsorption of a raw material on the base substrate, and decrease a growth rate of the crystal growing around the particle, in some cases. The pit is formed on the growth surface due to such a local decrease of the growth rate. Further, when particles made of the GaN crystal are attached on the base substrate, a polarity inversion domain, namely, a domain (inversion domain) where a polarity in a c-axis direction is inverted from that of surrounding crystals, appears in the GaN crystal, depending on a posture of the particle. For example, it is considered that there is a case in which when particles made of the GaN crystal are attached on the surface (+c-plane) of the base substrate in an inverted posture so that a front surface side becomes N-polarity plane (−c-plane), the polarity inversion domain is generated in the GaN crystal with this particle as a core in some cases. When the polarity inversion domain is generated in the GaN crystal, the local decrease of the growth rate is continued in this domain, and the pit is continuously formed on the growth surface.

Each facet plane constituting the inner surface of the pit acts so that a progressing direction of a dislocation is bent toward a center of the pit, the dislocation propagating in a direction orthogonal to the growth surface of the crystal. As a result, a dislocation dense domain where the dislocations are gathered and become dense, appears in the domain 10s in some cases. Further, a generation mechanism has been desicribed above, it is found that an inside of the domain 10s includes the polarity inversion domain in some cases. The dislocation dense domain and the polarity inversion domain become factors of causing deterioration of a quality of the crystal grown on the GaN substrate 10. According to intensive research by the inventors, it is found that the dislocation dense domain and the polarity inversion domain likely to exist locally at a center of the domain 10s or in the vicinity of the center of the domain 10s, specifically, at an intersection of diagonal lines of a hexagonal shape or a dodecagonal shape which is a shape in planar view of the domain 10s, or in the vicinity of the intersection. In this specification, a domain 10q which is a part of the domain 10s and which may include the dislocation dense domain and the polarity inversion domain with high probability, is referred to as "a center of the domain 10s", "the vicinity of the center of the domain 10s", and "a domain including the center of the domain 10s", etc. However, the term of "a center" using in this specification, is not necessarily used only for a purpose of meaning "a geometric center" of domain 10s, and is used for meanning abovementioned "a domain which may include the dislocation dense domain and the polarity inversion domain with high probability".

Figure 8:
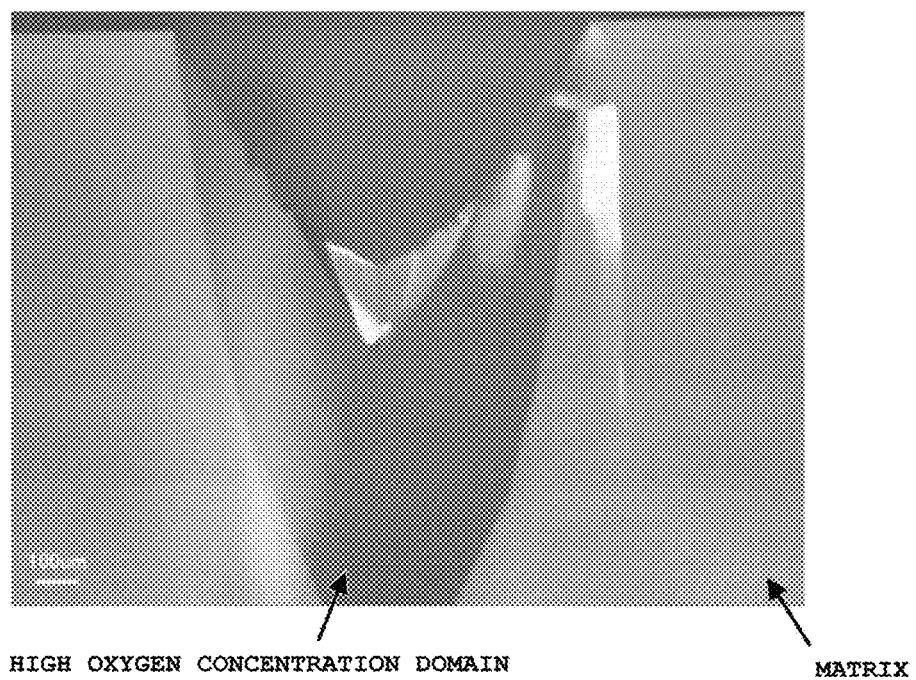
FIG. 8 is a cross-sectional image of a GaN substrate photographed using a fluorescence microscope.
Figure 9A:
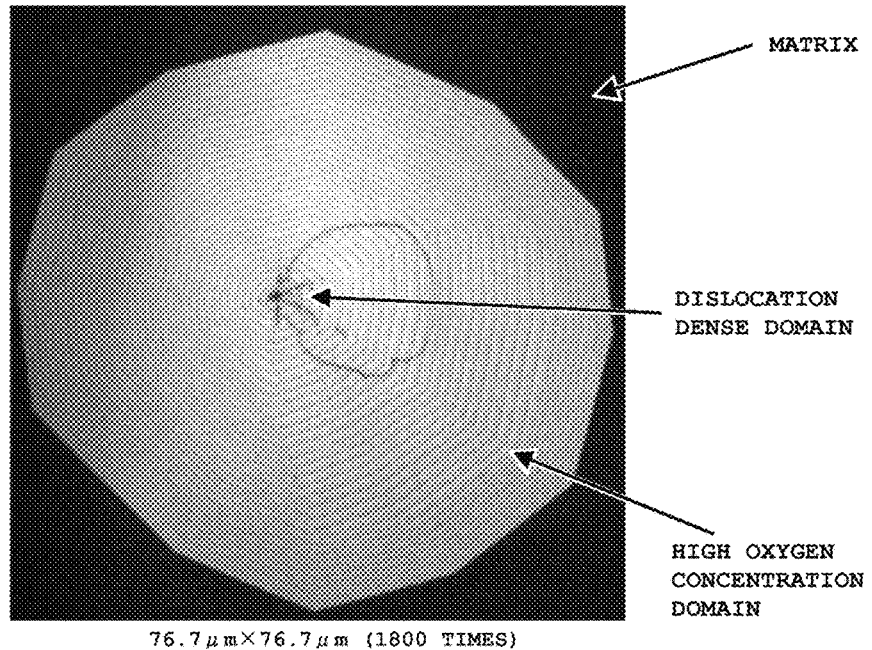
FIG. 9A and FIG. 9B are CL images of a GaN substrate, respectively.
Figure 9B:
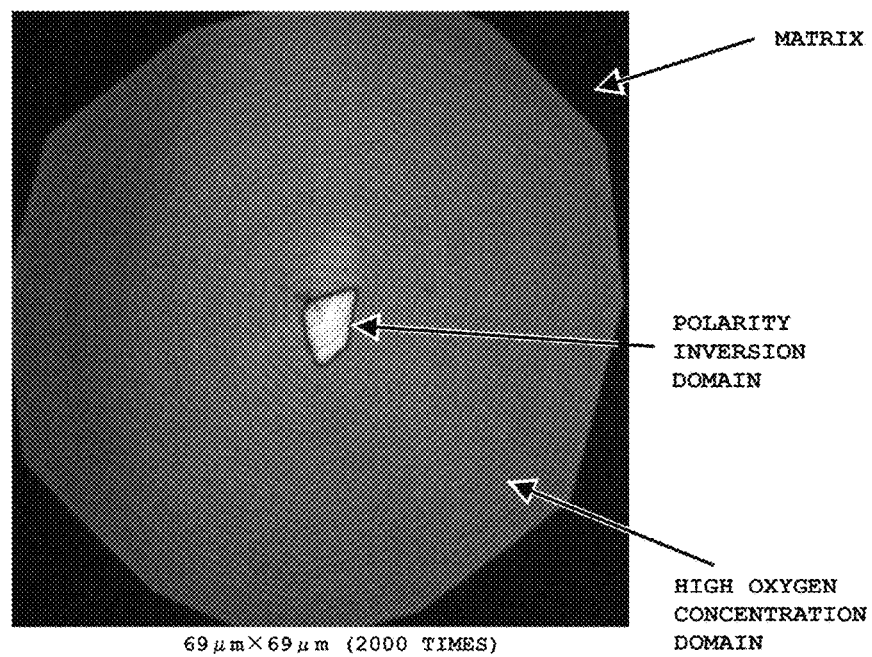

The domain 10s has a different contrast from a matrix 10m (The domain 10s appears darker than the matrix 10m), when the GaN substrate 10 is irradiated with ultraviolet ray, and the GaN substrate 10 is photographed using a camera. Therefore, a position, a size, and the like of the domain 10s can be identified using a fluorescence microscope for example. In addition, the domain 10s can also be identified by a cathode luminescence (referred to as CL hereafter) method of irradiating the GaN substrate 10 with electron ray (electron beam). When the CL-method is used, the domain 10s appears brighter than the matrix 10m. By using the CL-method, it is also possible to observe the dislocation dense domain and the polarity inversion domain included in the domain 10s. FIG. 8 is a cross-sectional image of a GaN substrate photographed using the fluorescence microscope. From FIG. 8, a state can be seen in which the high oxygen concentration domain appears darker than the matrix. FIG. 9A and FIG. 9B are enlarged (planar) images of a GaN substrate photographed using the CL-method. From these views, a state can be seen in which the high oxygen concentration domain having a dodecagonal shape in planar view, appears brighter than the matrix therearound. Further from FIG. 9A, a state can be seen in which the dislocation dense domain exists locally in the vicinity of a center of the high oxygen concentration domain, and from FIG. 9B, a state can be seen in which the polarity inversion domain exists locally in the vicinity of the center of the high oxygen concentration domain.

An oxygen concentration (O-concentration) of the matrix 10m is for example $2\times10^{16}$ to $5\times10^{17}$ at·cm$^{-3}$. An O-concentration in the domain 10s is for example $1\times10^{18}$ to $1\times10^{20}$ at·cm$^{-3}$. A ratio of the O-concentration in the domain 10s to the O-concentration in the matrix 10m (the high oxygen concentration domain/the matrix) is for example 2 times or more, and 10 times or more in some cases. A dislocation density of the matrix 10m is for example $1\times10^{4}$ to $1\times10^{7}$ cm$^{2}$. A dislocation density of the dislocation dense domain that appears in the domain 10s is for example $1\times10^{8}$ to $1\times10^{10}$ cm$^{-2}$. A dimension (a diameter in planar view) of the domain 10s is for example 10 to 2000 μm. Dimensions (diameters in planar view) of the dislocation dense domain and the polarity inversion domain are respectively 5 to 200 μm for example.

A disk-shaped substrate with a diameter of about 2 to 6 inches and a thickness of 0.2 to 1.0 mm, can be used as the GaN substrate 10, for example. A front surface 10a of the GaN substrate 10 is configured as a surface which is parallel to the (0001) plane of the GaN crystal, or which has an inclination within ±5°, preferably within ±1° with respect to the (0001) plane. The GaN substrate 10 may contain impurities such as silicon (Si) or magnesium (Mg) at a predetermined concentration ratio. The front surface 10a and a back surface 10b of the GaN substrate 10 may be in an as-grown state, or may be subjected to a predetermined surface treatment (a polishing treatment or an etching treatment). However, they are merely examples, and this embodiment is not limited thereto.
(Perforating Step)

After preparing the GaN substrate 10, the GaN substrate 10 is irradiated with laser beam. Irradiation of laser beam is performed aiming at at least a part of the domain 10s which is included in the GaN substrate 10, specifically, the domain 10q which includes the center of the domain 10s or the vicinity thereof, and which may include the dislocation dense domain or the polarity inversion domain with high probability. Then, a through-hole 10h penetrating the GaN substrate 10 in the thickness direction is formed.

Figure 2:
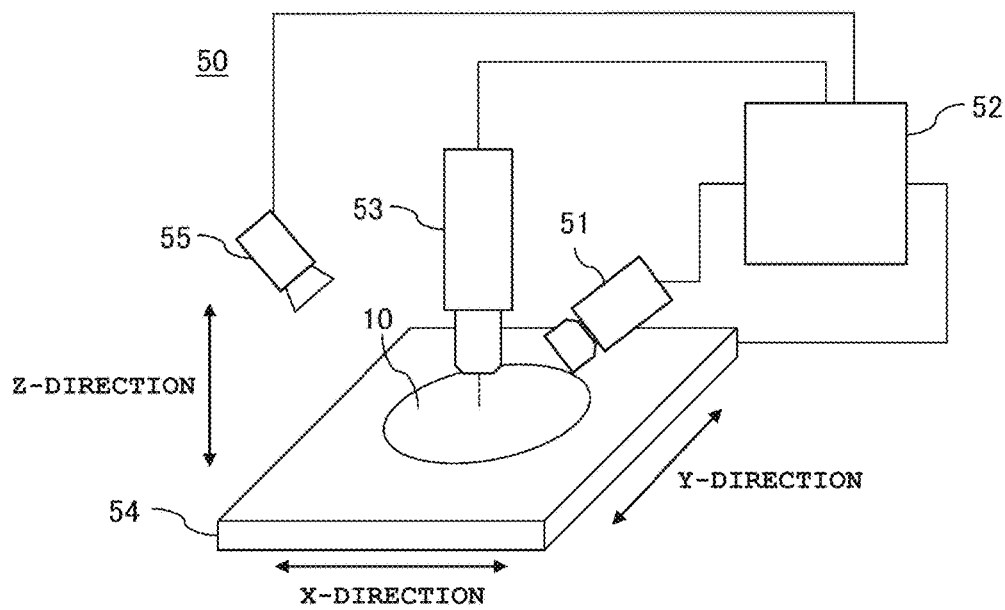
FIG. 2 is a schematic configuration view of a laser processing machine 50 used in a perforating step.

For example, this processing can be performed using a laser processing machine 50 as shown in FIG. 2. The laser processing machine 50 includes an XY stage 54 for placing a processing object thereon, an excitation light source 55 for irradiating the processing object placed on the XY stage 54 with ultraviolet ray, a photographing optical system 51 including an ultraviolet filter and a CCD camera, etc., a laser irradiation system 53 including an Nd:YAG laser oscillator, etc., and a controller 52 connected to these members and controls operations of these members. The controller 52 is configured as a computer including CPU, a memory, a memory device, and the like, for example. A series of processing described later is executed by reading a program stored in the memory device into a memory and executing the program by the CPU. Explanation will be given hereafter for an example of processing of the perforating step executed by the controller 52.

When the GaN substrate 10 is placed on the XY stage 54, the GaN substrate 10 is irradiated with ultraviolet ray, and its front surface 10a is photographed. The photographed image is transmitted to the controller 52. The controller 52 analyzes the received image using a predetermined image recognition technique. In this image recognition, for example, separation or contour extraction of the domain 10s and the matrix 10m is performed from a distribution, etc., of light-dark or color in the image. Various method utilizing known techniques can be used as a specific method of the image recognition, and a detailed explanation thereof is omitted here. After identifying a position (coordinate) and the contour of the domain 10s existing on the front surface 10a of the GaN substrate 10, the XY stage 54 is moved by a predetermined distance toward an X-direction and a Y-direction in FIG. 2. Then, at least a part of the domain 10s, specifically, the domain 10q which includes the center of the domain 10s or the vicinity thereof, and which may include the dislocation dense domain or the polarity inversion domain with high probability, is irradiated with laser beam. Thereby, the through-hole 10h penetrating the GaN substrate 10 in the thickness direction is formed. Thereafter, by repeating the above processing a predetermined number of times, all dislocation dense domains and polarity inversion domains included in the GaN substrate 10 are removed from the GaN substrate 10 by punching processing (by punching). FIG. 3A shows the front surface 10a of the GaN substrate 10 after performing the perforating step. FIG. 3B shows a vertical cross-section of the GaN substrate 10 around the through-hole 10h. When the domain 10s is punched, it is sufficient to punch at least the domain 10q, and it is not necessary to completely punch an entire domain 10s. As shown in FIG. 3B, by punching only the domain 10q in the domain 10s, and leaving an outer portion of the domain 10q in the domain 10s on the GaN substrate 10, a processing time of the embedding step performed after this step can be shortened, and a productivity of substrate processing can be improved.

When a size of the domain 10s viewed from a Z-direction shown in FIG. 2 is sufficiently smaller than a beam cross-section of laser beam, the domain 10q which may include the dislocation dense domain and the polarity inversion domain can be completely eliminated by a single laser punching processing to the vicinity of the center of the domain 10s, as shown in FIG. 3C.

Further, when the size of the domain 10s viewed from the Z-direction is almost the same as the size of the beam cross-section of laser beam (including when the size of the domain 10s is slightly smaller or slightly larger than the size of the beam cross-section of laser beam), the domain 10q which may include the dislocation dense domain and the polarity inversion domain can be completely eliminated by the laser punching processing of multiple number of times that performed intermittently while shifting a position of the XY stage 54, as shown in FIG. 3D.

There is a case in which the size of the domain 10s viewed from the Z-direction is larger (extends longer) than the beam cross-section of laser beam due to a circumstance in which a plurality of high oxygen concentration domains are combined with each other. In this case, an outershape (contour, silhouette) of the domain 10s is identified when the image recognition is performed by the controller 52, and intermittent irradiation of laser beam is performed multiple number of times or continuous irradiation of laser beam is performed, while shifting an irradiating position along the outershape of the identified domain 10s (along a longitudinal direction). Thereby, the domain 10q which may include the dislocation dense domain and the polarity inversion domain, can be completely eliminated. FIG. 3E shows an example of forming a rectangular (I-shaped) through-hole 10h having a transverse cross-sectional shape (planar shape) following an outershape of the domain 10q by performing intermittent irradiation of laser beam while shifting the XY stage 54. FIG. 3F shows an example of forming an I-shaped through-hole 10h having a planar shape following the outershape of the domain 10q by performing continuous irradiation of laser beam while shifting the XY stage 54. These methods can be similarly applied to a case that a shape of the domain 10q is a shape (such as L-shape, T-shape, H-shape, V-shape, +-shape, E-shape, F-shape) which is obtained by arbitrarily combining a plurality of rectangles.

In any case, it is preferable to control laser beam irradiating conditions (a beam diameter, an irradiating position, or a number of times of irradiation, etc.) so that a minimum width, namely, a minimum crossing width D of the through-hole 10h as viewed from the front surface 10a side of the GaN substrate 10 is set to for example 300 µm or less, preferably 200 µm or less. When the minimum crossing width D exceeds 300 µm, it is sometimes difficult to embed the inside of the through-hole 10h with the GaN crystal without gaps in the embedding step described later. By setting the minimum crossing width D to 300 µm or less, the inside of the through-hole 10h can be embedded with the GaN crystal without gaps. By setting the minimum crossing width D to 200 µm or less, the embedding of the GaN crystal is more surely performed. From a comparison between FIG. 3E and FIG. 3F, it is found that a case that intermittent irradiation of laser beam is performed multiple number of times, is more preferable than a case that continuous irradiation of laser beam is performed, in a point of reducing the minimum crossing width D. In contrast, a case that continuous irradiation of laser beam is performed, is more preferable than a case that intermittent irradiation of laser beam is performed multiple number of times, in a point of forming an inner surface of the through-hole 10h into a simple and smooth shape.

Processing conditions in the perforating step are as follows, for example.

Laser wavelength: 532 nm, 355 nm, 266 nm, 213 nm, etc.
Laser output: 3 to 10 W
Laser beam diameter: 300 µm or less, preferably 200 µm or less (Surface Polishing Step, Cleaning Step)

Thereafter, a surface polishing step for polishing the front surface 10a of the GaN substrate 10 is performed using a slurry containing abrasive grains having a predetermined grain size. Thereby, the front surface 10a of the GaN substrate 10 can be formed into a mirror surface state.

When the abovementioned perforating step is performed, foreign materials (residues) generated during laser processing, are attached on the inner surface of the through-hole 10h in some cases. Further, the GaN crystal is partially damaged by heat during laser irradiation, and a damage layer in which crystallinity has been changed (for example, an amorphized damage layer, or a polycrystallized damage layer), is formed on the inner surface of the through-hole 10h in some cases. Therefore, it is preferable to perform a cleaning step such as etching the inner surface of the through-hole 10h, after the perforating step is performed. An acidic etching solution such as hydrochloric acid (HCl) solution, or an alkaline etching solution such as potassium hydroxide (KOH) solution can be used in etching, for example. By performing the cleaning step, the residues attached on the inner surface of the through-hole 10h and the damage layer formed on the inner surface of the through-hole 10h, can be removed. As a result, a quality of the GaN crystal grown in the through-hole 10h in the embedding step described later, can be improved.

Either of these steps (surface polishing, cleaning) may be performed first. However, from a viewpoint of completely removing the slurry and the residue invaded into the through-hole 10h, it is preferable to perform the cleaning step after the surface polishing step. Further, in a case in which the front surface 10a of the GaN substrate 10 can be simultaneously etched by performing the cleaning step, and in which this surface can be formed into the mirror surface state, the surface polishing step may not be performed.

(Embedding Step)

After the surface polishing step and cleaning step are performed, embedding processing is performed, which is the processing of growing the GaN crystal in the through-hole 10h and embedding at least a part of the inside of the through-hole 10h with the GaN crystal.

Figure 4A:
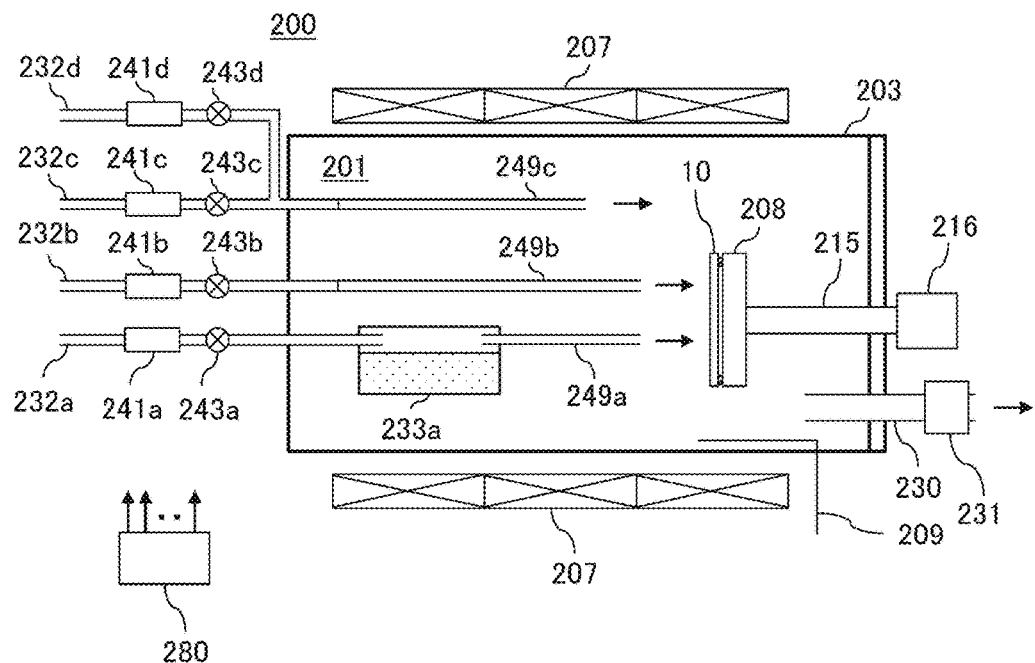
FIG. 4A is a schematic configuration view of a vapor phase growth apparatus 200 used in an embedding step.

This processing can be performed using a vapor phase growth apparatus (HVPE apparatus) 200 as shown in FIG. 4A, for example. The HVPE apparatus 200 includes an airtight container 203 which is made of a heat-resistant material such as quartz, and which has a reaction chamber (crystal growth chamber) 201 formed therein. A susceptor 208 as a supporting plate for holding the GaN substrate 10 is provided in the reaction chamber 201. The susceptor 208 is connected to a rotating shaft 215 of the rotating mechanism 216, and is configured to be rotatable. Gas supply pipes 232a to 232c for supplying HCl gas, ammonia ($NH_3$) gas, or nitrogen ($N_2$) gas into the reaction chamber 201, are connected to one end of the airtight container 203. A gas supply pipe 232d for supplying hydrogen ($H_2$) gas is connected to the gas supply pipe 232c. Flow rate controllers 241a to 241d, and valves 243a to 243d, are respectively provided to the gas supply pipes 232a to 232d in this order from the upstream side. A gas generator 233a for housing Ga melt as a raw material, is provided on a downstream of the gas supply pipe 232a. A nozzle 249a for supplying gallium chloride (GaCl) gas generated by a reaction between HCl gas and Ga melt toward the GaN substrate 10 held on the susceptor 208 is connected to the gas generator 233a. Nozzles 249b and 249c for supplying various gasses supplied from these gas supply pipes toward the GaN substrate 10 held on the susceptor 208 are respectively connected to the downstream side of the gas supply pipes 232b and 232c. An exhaust pipe 230 for exhausting an inside of the reaction chamber 201 is provided to the other end of the airtight container 203. A pump 231 is provided to the exhaust pipe 230. A zone heater 207 for heating an inside of the gas generator 233a and the GaN substrate 10 held on the susceptor 208 to a desired temperature, is provided on an outer periphery of the airtight container 203. A temperature sensor 209 for measuring the temperature in the reaction chamber 201 is provided in the airtight container 203. Each member of the HVPE apparatus 200 is connected to a controller 280 configured as a computer, and is configured so that processing procedures and processing conditions described later are controlled by a program executed by the controller 280.

In the embedding step, for example, the following processing procedure is executed by the abovementioned HVPE apparatus 200. First, Ga melt as a raw material is housed in the gas generator 233a, and the GaN substrate 10 is held on the susceptor 208. Then, $H_2$ gas (or a mixed gas of $H_2$ gas and $N_2$ gas) is supplied into the reaction chamber 201, while heating and exhausting the inside of the reaction chamber 201. Theareafter, in a state in which a temperature, a pressure, and an atmosphere in the reaction chamber 201 reaches a desired processing temperature, a desired processing pressure, and a desired atmosphere, gasses are supplied from the gas supply pipes 232a and 232b, and then GaCl gas and $NH_3$ gas are supplied as source gasses to the front surface 10a of the GaN substrate 10. Thereby, the GaN crystal is epitaxially grown in the through-hole 10h, and the inside of the through-hole 10h is embedded with a single crystal of GaN. A surface of the GaN crystal embedded in the through-hole 10h becomes the (0001) plane similarly to the front surface 10a of the GaN substrate 10. As described above, the dislocation dense domain and the polarity inversion domain are removed from the GaN substrate 10 by performing the perforating step. Therefore, the GaN crystal to be grown in the through-hole 10h becomes a high-quality crystal in which a dislocation density is low, and which does not include the polarity inversion domain. In this step, in order to supress decomposition of the crystal constituting the GaN substrate 10, $NH_3$ gas is preferably supplied prior to HCl gas, for example, before heating the reaction chamber 201. Further, in order to perform uniform embedding of the GaN crystal in the through-hole 10h formed in the GaN substrate 10, this step is preferably performed in a state of rotating the susceptor 208.

Processing conditions in the embedding step are as follows, for example.

Processing temperature (temperature of GaN substrate): 980 to 1100° C., preferably 1050 to 1100° C.

Processing pressure (pressure in reaction chamber): 90 to 105 kPa, preferably 90 to 95 kPa Partial pressure of GaCl gas: 1.5 to 15 kPa
Partial pressure of NH$_3$ gas/Partial pressure of GaCl gas: 2 to 6

Flow rate of N$_2$ gas/Flow rate of H$_2$ gas: 1 to 20

Figure 4B:
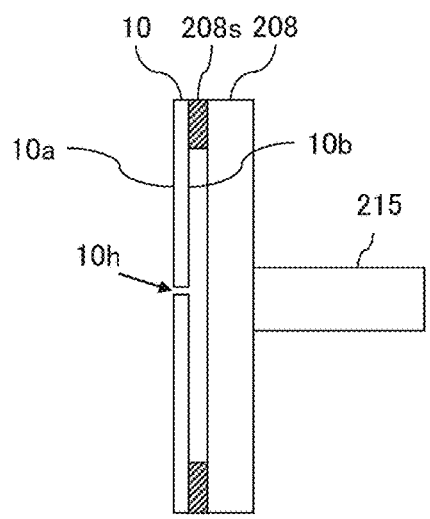
FIG. 4B is a cross-sectional configuration view of the GaN substrate 10 held on a susceptor 208.

The embedding step is performed in a state of placing the GaN substrate 10 on the susceptor 208 as described above so as not to seal an opening (also referred to as a back side opening hereafter) which is one of two openings of the through-hole 10h and is located on the back surface 10b side opposed to the susceptor 208. In this embodiment, as an example, as shown in FIG. 4B, an annular spacer 208s is disposed between the GaN substrate 10 and the susceptor 208 so as not to seal the back side opening of the through-hole 10h. With a constitution so as not to seal the back side opening of the through-hole 10h, an air-passage (conductance) toward a direction from the front surface 10a side to the back surface 10b side of the GaN substrate 10, can be secured. As a result, the supply of the source gas into the through-hole 10h can be prompted, and the growth of the GaN crystal in the through-hole 10h can be accelerated. In order to continuously supply the source gas into the through-hole 10h, it is necessary to discharge gasses flowing into a gap between the back surface 10b of the GaN substrate 10 and the susceptor 208. Therefore, it is preferable to secure a gas vent by providing the spacers 208s discontinuously in a circumferential direction of the GaN substrate 10, or to provide the gas vent penetrating the susceptor 208 in a thickness direction. The constitution of not sealing of the back side opening of the through-hole 10h is not limited to a case of providing the spacer 208s, and grooves or protrusions may be provided on an upper surface (surface for supporting substrate) of the susceptor 208.

In the embedding step, the front surface 10a of the GaN substrate 10 can be flattened by growing the +c-plane of the GaN crystal on at least the front surface 10a side portion of the GaN substrate 10 in the through-hole 10h. This surface becomes high-quality crystal surface which does not include the dislocation dense domain and the polarity inversion domain and in which the pit does not appear. FIG. 5A shows a state of a front surface 20a of the GaN substrate 20. FIG. 5B shows a state of a back surface 20b thereof.

As shown in FIG. 5A, the GaN substrate 20 is configured as a crystal substrate having a flat surface which does not include the dislocation dense domain and the polarity inversion domain, and in which the pit does not appear. A small dent sometimes remains at a position corresponding to the through-hole 10h on the front surface 20a of the GaN substrate 20, depending on the processing conditions in the embedding step, or various conditions such as a depth or a shape of the through-hole 10h. However, even in such a case, this dent can be completely removed by polishing a surface of the front surface 20a of the GaN substrate 20, or by finely adjusting the processing conditions in the embedding step. Even in any case, the front surface 20a of the GaN substrate 20 becomes a high-quality surface which can improve the quality of the crystal to be grown, when a GaN crystal film is epitaxially grown using this front surface 20a as a base.

In contrast, as shown in FIG. 5B, a particular configuration (trace) 20m suggesting that the through-hole 10h is embedded with the GaN crystal, exists on the back surface 20b of the GaN substrate 20. As shown in the cross-sectional configuration of the GaN substrate 20 in FIG. 5C and FIG. 5D, the trace 20m has various patterns.

For example, as shown in FIG. 5C, the back surface 20b of the GaN substrate 20 is almost completely flattened by the embedding of the GaN crystal, and therefore it is sometimes difficult to confirm the trace 20m by visual observation, depending on the processing conditions in the embedding step, or various conditions such as the depth and the shape of the through-hole 10h. However, even in such a case, a domain where the oxygen concentration is somewhat higher than that of the surrounding crystal, appears in the vicinity of the inner surface of the through-hole 10h. An existence of this domain can be confirmed using a known technique such as a fluorescence microscope. Further, this domain has different polishing-resistance property and etching property from the other domain. Therefore, this domain can become apparent by polishing the back surface 20b of the GaN substrate 20 using CMP-polishing, etc. Thus, even when confirmation by visual observation is difficult, it can be said that the trace 20m suggesting that the through-hole 10h is embedded with the GaN crystal, exists on the back surface 20b of the GaN substrate 20.

Further, for example, there is sometimes a less amount of source gas that reaches the back side opening of the through-hole 10h, depending on the processing conditions in the embedding step, or various conditions such as the depth and the shape of the through-hole 10h. Therefore, the crystal growth rate in the vicinity of the back side opening is sometimes relatively decreased. As a result, as shown in FIG. 5D, slightly dented traces 20m are sometimes remained on the back surface 20b of the GaN substrate 20 at positions corresponding to the through-holes 10h which have disappeared by the embedding of the GaN crystal.

(2) Effect Obtained by this Embodiment

According to this embodiment, one or more of the following effects can be obtained.

(a) By performing a series of steps from the perforating step to the embedding step, a finally obtained GaN substrate 20 can be a high-quality crystal substrate which does not include the dislocation dense domain and the polarity inversion domain. Thereby, when the GaN crystal film is epitaxially grown on the front surface 20a of the GaN substrate 20, this GaN crystal film can become a film having high crystallinity with a low dislocation density. Further, the finally obtained GaN substrate 20 is a crystal substrate which does not include the polarity inversion domain. Therefore, the generation of the pit on a surface of the GaN crystal film grown on the front surface 20a can also be suppressed. As a result thereof, properties of a semiconductor device manufactured using the GaN substrate 20, and a manufacturing yield thereof, can be improved.

Figure 10A:
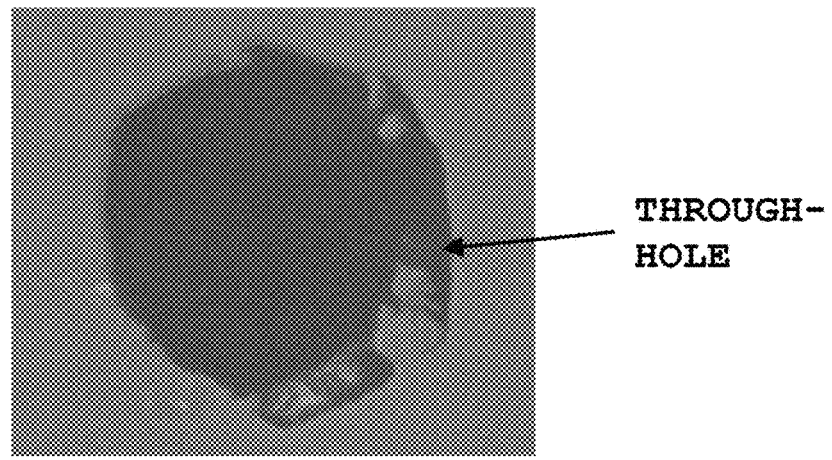
FIG. 10A is an optical microscope image of a GaN substrate after performing the perforating step.
Figure 10B:
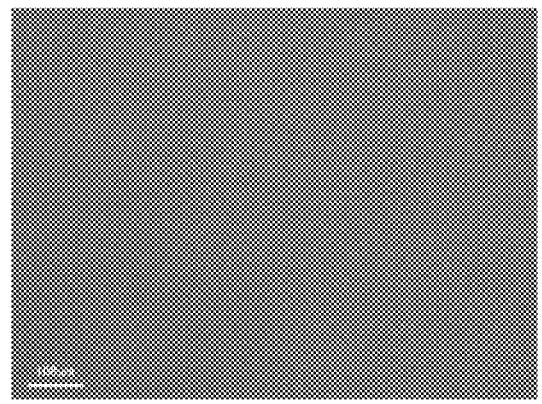
FIG. 10B and FIG. 10C are respectively optical microscope images of a GaN substrate after performing the embedding step.
Figure 10C:
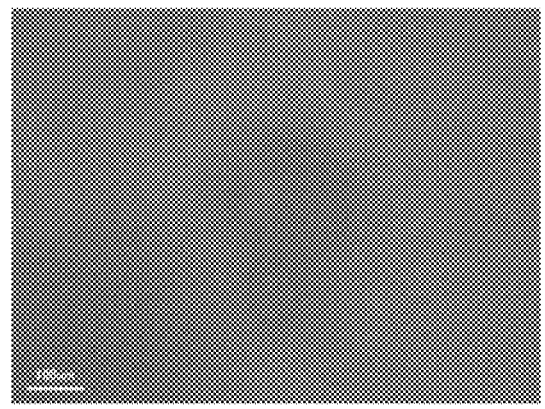

FIG. 10A is an optical microscope image obtained by photographing the GaN substrate after performing the perforating step. FIG. 10B is an optical microscope image obtained by photographing the GaN substrate after performing the embedding step, with a front surface focused from its front surface side. FIG. 10O is an optical microscope image obtained by photographing the GaN substrate after performing the embedding step, with a back surface focused from its front surface side. From these views, it is found that at least a front surface side opening of the through-hole is embedded with the GaN crystal without gaps, and the front surface of the GaN substrate is extremely flat and smooth surface. Further, it can also be confirmed that a trace of the embedding is generated slightly on the back surface side of the GaN substrate in some cases. It has been already confirmed by inventors that the grown film is a film having high crystallinity with a low dislocation density, and the pit does not appear on the front surface thereof, as a result of epitaxially growing a GaN crystal film on the front surface of the GaN substrate as shown in FIG. 10B.

Figure 11A:
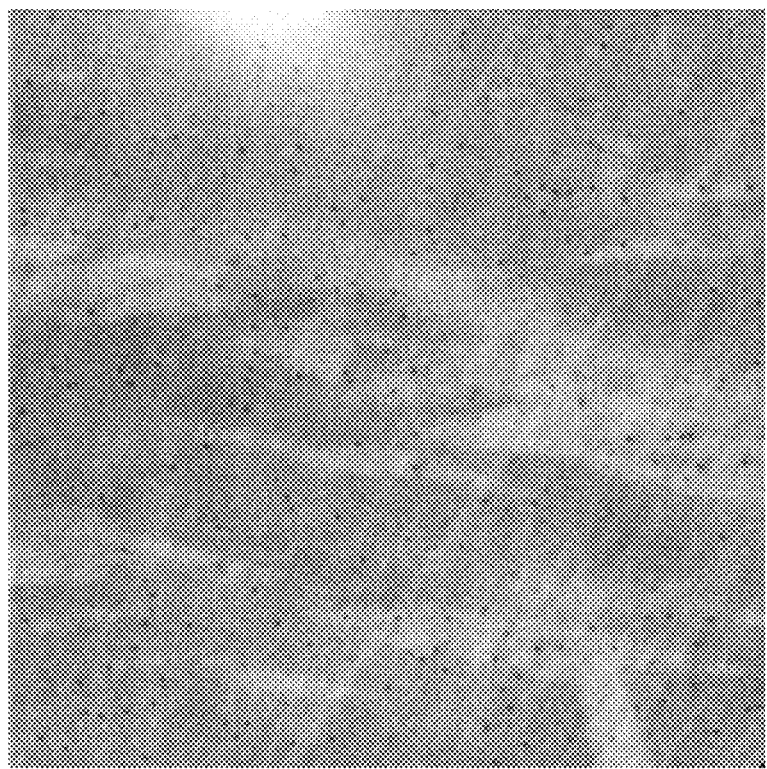
FIG. 11A is a CL image of the GaN crystal grown in the through-hole.
Figure 11B:
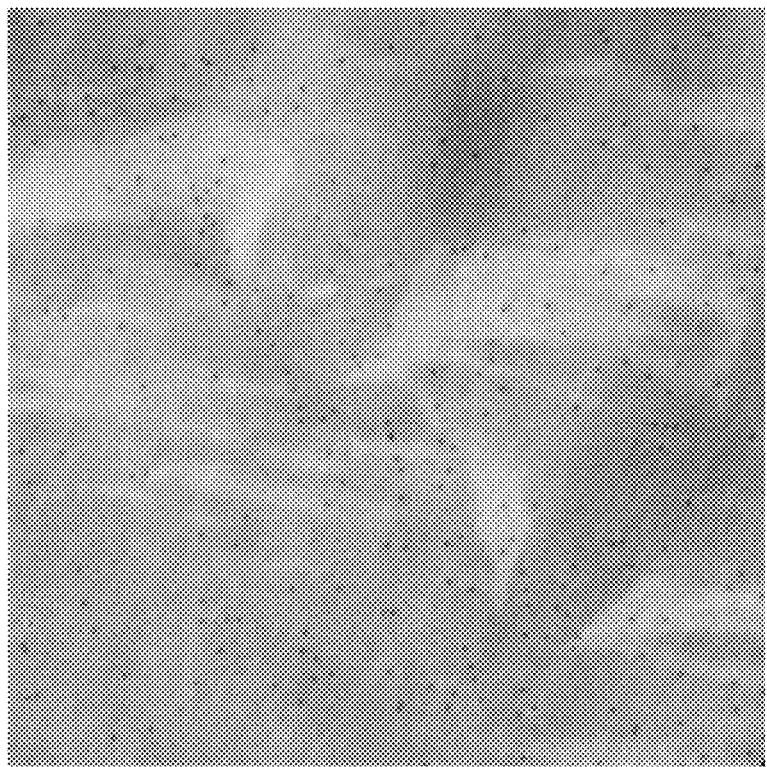
FIG. 11B is a CL image of the GaN crystal of a matrix.

FIG. 11A is a CL image of the GaN crystal grown in the through-hole in the embedding step. FIG. 11B is a CL image of the matrix (outside of the through-hole) of the GaN crystal constituting the GaN substrate. From FIGS. 11A and 11B, it is found that the quality of the GaN crystal grown in the through-hole is equivalent to the quality of the crystal of the matrix. It has been already confirmed by inventors that the dislocation density of the matrix is $1.5 \times 10^6$ cm$^{-2}$, and meanwhile the dislocation density of the domain containing the GaN crystal grown in the through-hole is $1.2 \times 10^6$ cm$^{-2}$. These values are given as one example. However, in any case, according to the method of this embodiment, it is found that the GaN crystal with a quality equivalent to the crystal of the matrix or a higher quality than the crystal of the matrix, can be grown in the through-hole.

(b) When the high oxygen concentration domain includes the polarity inversion domain, an etching rate of the polarity inversion domain is more increased than that of the other domain and the matrix. Namely, the polarity inversion domain has an etching selectivity as compared with the other domain and the matrix. Therefore, it is also conceivable to adopt a method that not laser processing but wet etching or the like is applied to the GaN substrate including the polarity inversion domain, and thereby the polarity inversion domain is preferentially etched and the through-hole is formed in the GaN substrate.

However, in this method using wet etching, the GaN substrate is excessively etched. As a result, the diameter and the thickness of the substrate are decreased, and further the substrate itself disappears, in some cases. Further, in this method, it is necessary to previously form a protective film on the back surface of the GaN substrate. However, it is not easy to obtain a proper protective film at a current state. Further, it is necessary to perform wet etching at a high temperature. In this case, a vaporization and a condensation of the etching solution are likely to occur, and therefore a safety of operation may be impaired such that it is difficult to take out the GaN substrate from the etching solution in which a degree of viscosity becomes high. In contrast, according to this embodiment in which the through-hole 10h is formed using the laser processing machine 50, the above problems can be solved.

Further, in the abovementioned method using wet etching, a domain where a crystal state is uncertain, sometimes remains on an inner wall of the through-hole formed by etching. Further, the inner wall of the through-hole is likely to be formed into a complicated (an intricated) shape. As a result, the quality of the crystal embedded in the through-hole is likely to deteriorate, or the embedding in the through-hole is likely to incomplete, in some cases. In contrast, according to this embodiment in which the through-hole 10h is formed by laser irradiation, a single crystal in a excellent crystal state can be surely exposed on the inner wall of the through-hole 10h, and the inner surface of the through-hole 10h can be formed into a smooth and simple shape. Thereby, the quality of the crystal to be embedded in the through-hole 10h can be improved, and the embedding of the crystal in the through-hole 10h can be surely performed.

(c) By not sealing the back side opening of the through-hole 10h in the embedding step, the air-passage for gas toward the direction from the front surface 10a side to the back surface 10b side of the GaN substrate 10 can be secured. As a result, the growth of the GaN crystal in the through-hole 10h can be accelerated, and the embedding of the GaN crystal in the through-hole 10h can be surely performed.

(3) Modified Examples

This embodiment is not limited to the abovementioned embodiment, and can be modified as the following modified examples.

(Modified Example 1)

As shown in a cross-sectional view of the GaN substrate 10 in FIG. 6A, in the perforating step, the laser beam irradiating condition may be controlled so that the shape of the through-hole 10h becomes a circular truncated cone shape in which an inner diameter is gradually increased from the front surface 10a side toward the back surface 10b side of the GaN substrate 10.

For example, by performing the irradiation of laser beam from the front surface 10a side toward the back surface 10b side of the GaN substrate 10 so as to focus laser beam on the front surface 10a of the GaN substrate 10, the abovementioned shape of the through-hole 10h can be realized. Further, for example, in the perforating step, by performing the irradiation of laser beam from the back surface 10b side toward the front surface 10a side of the GaN substrate 10 so as to focus laser beam on the front surface 10a of the GaN substrate 10, the abovementioned shape of the through-hole 10h can be realized as well.

By forming the shape of the through-hole 10h into the circular truncated cone shape, it becomes easy to suppress the minimum crossing width D of an opening (also referred to as a front side opening hereafter) which is one of two openings of the through-hole 10h, and is located on the front surface 10a side for supplying the source gas, to 300 μm or less, preferably 200 μm or less. As a result, in the embedding step, the embedding of the GaN crystal into the front side opening of the through-hole 10h can be more surely performed.

(Modified Example 2)

As shown in a cross-sectional view of the GaN substrate 10 in FIG. 6B, in the perforating step, the laser beam irradiating condition may be controlled so that the shape of the through-hole 10h becomes an inverted circular truncated cone shape in which the inner diameter is gradually decreased from the front surface 10a side toward the back surface 10b side of the GaN substrate 10.

For example, by performing the irradiation of laser beam from the front surface 10a side toward the back surface 10b side of the GaN substrate 10 so as to focus laser beam on the back surface 10b of the GaN substrate 10, the abovementioned shape of the through-hole 10h can be realized. Further, for example, in the perforating step, by performing the irradiation of laser beam from the back surface 10b side toward the front surface 10a side of the GaN substrate 10 so as to focus laser beam on the back surface 10b of the GaN substrate 10, the abovementioned shape of the through-hole 10h can be realized as well.

By forming the shape of the through-hole 10h into the inverted circular truncated cone shape, namely, enlarging the front side opening of the through-hole 10h, the supply of the source gas into the through-hole 10h in the embedding step can be prompted. Thereby, the embedding with the GaN crystal can be easily progressed in the entire area of the through-hole 10h. Further, the embedding with the GaN crystal can be efficiently progressed, the time required for the embedding step can be shortened, and the productivity of the GaN substrate 20 can be increased.

(Modified Example 3)

In the perforating step, the through-hole 10h may be formed by a method other than laser processing such as etching, an electric discharge processing, or machine processing. Even when the through-hole 10h is formed by these methods, the GaN substrate 20 which does not include the polarity inversion domain and the dislocation dense domain can be obtained by performing the surface polishing step, the cleaning step, and the embedding step. Namely, even in a case of forming the through-hole 10h by a method other than laser processing, the inside of the through-hole 10h can be embedded with the high-quality GaN crystal. Further, the abovementioned merit obtained by not sealing the back side opening of the through-hole 10h during the embedding step, and the merits described in modified examples 1 and 2 obtained by forming the shape of the through-hole 10h into the circular truncated cone shape or the inverted circular truncated cone shape, can be simiraly obtained.

However, as described above, the formation of the through-hole 10h by laser processing, has more merits in a point of the improvement of productivity, and safety, etc., than a formation of the through-hole 10h by etching. Further, it can be said that a complicated shape control such that the shape of the through-hole 10h is formed into the circular truncated cone shape or the inverted circular truncated cone shape, is more easily realized by laser processing than by etching.

<Second Embodiment of the Present Disclosure>

In the abovementioned embodiment, explanation has been given for an example in which the high oxygen concentration domain is identified by irradiation of ultraviolet ray or electron ray, and is removed. However, the present disclosure is not limited to such an embodiment. This is because that the high oxygen concentration domain sometimes includes the polarity inversion domain as described above, and in this case, the pit appears on the surface (growth surface) of the crystal. Further, the pit sometimes appears due to foreign materials (particles) attached on the surface of the base substrate, and the pit which appears for this reason, sometimes includes the dislocation dense domain even in a case of not including the polarity inversion domain. The pit formed on the surface can be identified by observation under a visual light range without using ultraviolet ray. Therefore, in this embodiment, the surface of the GaN substrate to be processed is observed under the visual light range, and the polarity inversion domain and the dislocation dense domain are removed from the GaN substrate by punching the observed pit with laser beam. This embodiment will be described heaafter, mainly for different points from the first embodiment.

Figure 12:
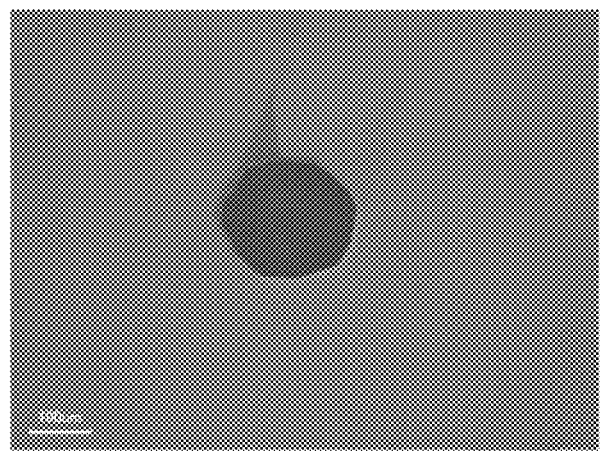
FIG. 12 is an optical microscope image of a pit formed on a front surface of a GaN substrate in an as-grown state.

In the preparing step, as exemplified in a planar configuration or cross-sectional configuration of FIG. 7A and FIG. 7B, a GaN substrate 10' made of GaN crystal and having one or more pits 10p on the front surface is prepared as the substrate to be processed. As such a substrate, a substrate in the as-grown state obtained by growing the GaN crystal so that the surface thereof becomes the (0001) plane, can be suitably used. FIG. 12 shows an enlarged image of the pit that appears on the front surface of the GaN substrate. As shown in FIG. 7B, a polarity inversion domain 10d which is a factor of generating the pit 10p, and the high oxygen concentration domain 10s including this polarity inversion domain 10d, exist on a bottom side of the pit photographed in FIG. 12. The requirements regarding the size and the thickness of the GaN substrate 10', the crystal orientation of the front surface, the impurity concentration, and the like, can be set similarly to the first embodiment.

Figure 13:
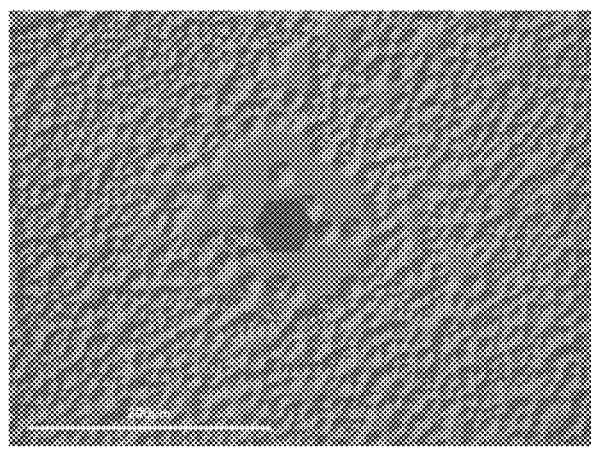
FIG. 13 is an optical microscope image of a pit re-appears by etching a front surface of a polished GaN substrate.

As the substrate to be processed, it is also possible to use a substrate obtained by polishing the (0001) plane which is the front surface of the GaN substrate in the as-grown state, and thereafter etching to the polished surface, to thereby make the pit re-appear on the polished surface. When the surface in the as-grown state is polished, the pit disappear once from that surface. However, when the polarity inversion domain having the etching selectivity exists on a bottom of the pit, the pit can be made re-appear by etching the polished surface. Etching can be performed using a halogen-based etching gas such as HCl gas or chlorine ($Cl_2$) gas, the acidic etching solution such as HCl solution, or the alkaline etching solution such as KOH solution. FIG. 13 shows a state in which the front surface of a polished GaN substrate is etched, and the pit re-appears on the front surface thereof.

The perforating step can be performed in the same processing procedures and under the same processing conditions as the perforating step in the first embodiment, except that it is not necessary to irradiate the GaN substrate 10' with ultraviolet ray. There is a case in which the size of the pit 10p viewed from the Z-direction in FIG. 2 is larger than the beam cross-section of laser beam due to a circumstance in which a plurality of pits are combined with each other. In this case, an outershape of the pit 10p is identified when the image recognition is performed by the controller 52, and then intermittent irradiation of laser beam is performed multiple number of times or continuous irradiation of laser beam is performed, while shifting the irradiation position along the outershape of the identified pit 10p. This point is also similar to the first embodiment. By performing the perforating step, the polarity inversion domain 10d that exists on the bottom of the pit 10p can be completely removed from the GaN substrate 10'. At this time, it is sufficient to punch at least the polarity inversion domain 10d, and it is not necessary to completely punch the entire high oxygen concentration domain 10s. This point is also similar to the first embodiment.

The series of steps from the surface polishing step to the embedding step can be performed in the same processing procedures and under the same processing conditions as those of the first embodiment. When the surface polishing step is performed before the perforating step, it becomes difficult to identify the pit 10p in the perforating step. Therefore, at least in this embodiment, it is necessary to perform the surface polishing step after performing the perforating step.

In this embodiment as well, the finally obtained GaN substrate can be the high-quality crystal substrate which does not include the polarity inversion domain and the dislocation dense domain and in which the pit does not appear on the front surface. As a result, the quality of the crystal film grown on the substrate, the properties of the semiconductor device manufactured using this substrate, and the manufacturing yield thereof, can be improved.

In this embodiment as well, the abovementioned effect obtained by not using wet etching in the perforating step, can be obtained similarly to the first embodiment. In the abovementioned method using wet etching, although the pit that appears due to the polarity inversion domain can be removed, the pit that appears due to other causes cannot be removed. In contrast, according to this embodiment, a secondary effect is obtained in which all pits can be made surely disappear regardless of the factor of generating the pit, and the front surface of the finally obtained GaN substrate can be easily flattened.

It is matter of course that the similar effect as the first embodiment can be obtained regarding other points. In this embodiment, it is not necessary to perform irradiation of ultraviolet ray in the perforating step. Therefore, it is easy to reduce a processing cost.

<Another Embodiment of the Present Disclosure>

As described above, explanation has been given specifically for the embodiments of the present disclosure. However, the present disclosure is not limited thereto, and can be variously modified in a range not departing from the gist of the disclosure.

For example, in the abovementioned embodiment, explanation has been given for an example in which the irradiation of laser beam to the GaN substrate is automatically performed by the controller 52 of the laser processing machine 50. However, the present disclosure is not limited thereto. For example, the identification of the high oxygen concentration domain or the pit may be manually performed without using the image recognition by a computer. Further, laser beam may be directed thereto manually.

Further, for example, in the abovementioned embodiment, explanation has been given for a case of using the hydride vapor phase epitaxy method (HVPE method) as the vapor growth method in the embedding step. However, the present disclosure is not limited thereto. For example, in the embedding step, a vapor growth method other than the HVPE method such as a metal organic chemical vapor deposition method (MOCVD method) or an oxide vapor phase epitaxy method (OVPE method) may be used. Even in these cases, similar effect as the abovementioned embodiment can be obtained. Further, for example, in the embedding step, a liquid phase growth may be performed by a flux method using sodium (Na) or the like as a flux, a melt growth method performed under a high pressure and a high temperature, an ammonothermal method, or the like. Even in these cases, similar effect as abovementioned embodiment can be obtained.

Further, for example, in the abovementioned embodiment, explanation has been given for a method of obtaining one GaN substrate by performing a series of steps from the preparing step to the embedding step. However, the present disclosure is not limited thereto. For example, a plurality of GaN substrates can be obtained by performing a series of steps from the preparing step to the embedding step, performing a fully-growing step of thickly epitaxially growing the GaN crystal on the front surface of the GaN substrate, and thereafter slicing the substrate. Even in this case, similar effect as the abovementioned embodiment can be obtained.

It is noted that although the processing procedure and the processing condition in the fully-growing step can be the same as those of the abovementioned embedding step, it is also acceptable that they are different from each other.

This is because the embedding step is mainly performed for embedding the inside of the through-hole. Therefore, in the embedding step, it is preferable to grow the crystal under a condition that emphasizes a growth in a direction along a main surface (c-plane) (creeping direction) rather than a growth toward the main surface direction (orthogonal direction to the surface, namely, c-axis direction). For example, in the embedding step, it is preferable to grow a crystal under a condition so that the crystal growth toward the creeping direction of the substrate in the embedding step becomes more active than the crystal growth toward the creeping direction of the substrate in the fully-growing step, namely, so that a growth rate toward the creeping direction of the substrate in the embedding step is more increased than a growth rate toward the creeping direction of the substrate in the fully-growing step.

In contrast, the fully-growing step is mainly performed to grow the GaN crystal at a high speed and thick on the substrate after embedding. Therefore, in the fully-growing step, it is preferable to grow the crystal under a condition that emphasizes the growth toward the main surface direction, rather than the growth toward the creeping direction. For example, in the fully-growing step, it is preferable to grow a crystal under a condition so that the crystal growth toward the main surface direction of the substrate in the fully-growing step becomes more active than the crystal growth toward the main surface direction of the substrate in the embedding step.

As a method for achieving the abovementioned object, for example, there is a method of making the atmosphere in the reaction chamber 201 different between the embedding step and the fully-growing step. For example, a ratio ($N_2/H_2$) of a partial pressure of $N_2$ gas to a partial pressure of $H_2$ gas in the reaction chamber 201 in the fully-growing step is set to be smaller than a ratio ($N_2/H_2$) of a partial pressure of $N_2$ gas to a partial pressure of $H_2$ gas in the reaction chamber 201 in the embedding step. As a result, in the embedding step, the crystal growth toward the creeping direction becomes relatively active, and in the fully-growing step, the crystal growth toward the main surface direction becomes relatively active.

As another method for achieving the abovementioned object, for example, there is a method of making the processing temperature different between the embedding step and the fully-growing step. For example, the processing temperature in the fully-growing step is set to be lower than the processing temperature in the embedding step. As a result, in the embedding step, the crystal growth toward the the creeping direction becomes relatively active, and in the fully-growing step, the crystal growth toward the main surface direction becomes relatively active.

As further another method for achieving the abovementioned object, there is a method of making a ratio ($NH_3$/GaCl) of a supply flow rate of $NH_3$ gas and a supply flow rate of GaCl gas different between the embedding step and the fully-growing step. For example, the ratio of $NH_3$ flow rate/GaCl flow rate in the fully-growing step is set to be larger than the ratio of $NH_3$ flow rate/GaCl flow rate in the embedding step. As a result, in the embedding step, the crystal growth toward the the creeping direction becomes relatively active, and in the fully-growing step, the crystal growth toward the main surface direction becomes relatively active.

The processing conditions in the fully-growing step are as follows, for example.

Processing temperature (temperature of GaN substrate): 980 to 1100° C.

Processing pressure (pressure in reaction chamber): 90 to 105 kPa, preferably 90 to 95 kPa Partial pressure of GaCl gas: 1.5 to 15 kPa Partial pressure of $NH_3$ gas/Partial pressure of GaCl gas: 4 to 20

The present disclosure is not limited to GaN, and for example, can be also suitably applied when manufacturing a substrate made of a group-III nitride crystal such as aluminum nitride (AlN), aluminum gallium nitride (AlGaN), indium nitride (InN), indium gallium nitride (InGaN), aluminum indium gallium nitride (AlInGaN) or the like, namely, a group-III nitride crystal represented by a composition formula of $Al_xIn_yGa_{1-x-y}N$ ($0 \leq x+y \leq 1$, $0 \leq x \leq 1$, $0 \leq y \leq 1$). Even in these crystals, similarly to GaN, there is case of including the high oxygen concentration domain. As a result, when the (0001) plane is used as the growth plane, the pit due to the polarity inversion domain is sometimes generated similarly to GaN. Even in these cases, similar effect as the abovementioned embodiment can be obtained by performing a series of steps from the perforating step to the embedding step.

<Preferable Aspects of the Present Disclosure>

Preferable aspects of the present disclosure will be supplementarily described hereafter.

(Supplementary Description 1)

According to an aspect of the present disclosure, there is provided a method for manufacturing a group-III nitride substrate, including:

a preparing step of preparing a substrate which is made of a group-III nitride crystal and which has a high oxygen concentration domain where an oxygen concentration is higher than that of a matrix of the crystal;

a perforating step of irradiating the substrate with laser beam aiming at the high oxygen concentration domain, forming a through-hole penetrating the substrate in a thickness direction, and removing at least a part of the high oxygen concentration domain from the substrate; and an embedding step of embedding at least a part of an inside of the through-hole by growing the group-III nitride crystal in the through-hole.

(Supplementary Description 2)

Preferably, there is provided the method of the supplementary description 1, wherein in the perforating step, irradiation of laser beam is performed aiming at a domain which is a part of the high oxygen concentration domain, and which includes a center of the high oxygen concentration domain. More preferably, in the perforating step, the domain which is a part of the high oxygen concentration domain and which includes the center thereof, is removed from the substrate, and the other domain thereof is left on the substrate without being removed.

(Supplementary Description 3)

Preferably, there is provided the method of the supplementary description 1 or 2, wherein in the perforating step, irradiation of laser beam is performed aiming at a domain which is a part of the high oxygen concentration domain, and which includes an intersection of diagonal lines of a polygonal shape which is either a hexagonal shape or a dodecagonal shape in planar view. More preferably, the domain which is a part of the high oxygen concentration domain and which includes the intersection of diagonal lines of the polygonal shape, is removed from the substrate, and the other domain thereof is left on the substrate without being removed.

(Supplementary Description 4)

Preferably, there is provided the method of any one of the supplementary descriptions 1 to 3, wherein in the perforating step, a domain which is a part of the high oxygen concentration domain and which includes a dislocation dense domain or a polarity inversion domain, is removed from the substrate. More preferably, a domain which is a part of the high oxygen concentration domain and which includes the dislocation dense domain or the polarity inversion domain, is removed from the substrate, and the other domain (a domain which does not include both the dislocation dense domain and the polarity inversion domain), is left on the substrate without being removed.

(Supplementary Description 5)

Preferably, there is provided the method of the supplementary description 1, wherein in the preparing step, a substrate in an as-grown state is prepared as the substrate, which is obtained by growing the group-III nitride crystal represented by a composition formula of $Al_xIn_yGa_{1-x-y}N$ ($0 \le x+y \le 1$, $0 \le x \le 1$, $0 \le y \le 1$) so that its surface becomes (0001) plane, and in the perforating step, at least a part of the high oxygen concentration domain existing on a bottom surface side of a pit which is observed on a front surface of the substrate, is removed from the substrate due to formation of the through-hole by irradiating the substrate with laser beam aiming at the pit.

(Supplementary Description 6)

Preferably, there is provided the method of the supplementary description 1, wherein in the preparing step, as the substrate, a substrate is prepared so that a pit appears on a front surface of the substrate by polishing (0001) plane which is the front surface of the substrate made of the group-III nitride crystal reperesented by a composition formula of $Al_xIn_yGa_{1-x-y}N$ ($0 \le x+y \le 1$, $0 \le x \le 1$, $0 \le y \le 1$), and thereafter etching the polished surface, and in the perforating step, at least a part of the high oxygen concentration domain existing on a bottom surface side of a pit which is observed on the front surface of the substrate, is removed from the substrate due to formation of the through-hole by irradiating the substrate with laser beam aiming at the pit.

(Supplementary Description 7)

Preferably, there is provided the method of the supplementary description 5 or 6, wherein in the perforating step, a domain which is a part of the high oxygen concentration domain and which includes at least the polarity inversion domain (and the dislocation dense domain), is removed from the substrate. More preferably, a domain which is a part of the high oxygen concentration domain and which includes at least the polarity inversion domain (and the dislocation dense domain), is removed from the substrate, and the other domain thereof (a domain which does not include both the dislocation dense domain and the polarity inversion domain) is left on the substrate without being removed.

(Supplementary Description 8)

Preferably, there is provided the method of any one of the supplementary descriptions 1 to 7, wherein in the perforating step, a light-emitting state of the crystal is observed when irradiating the substrate with ultraviolet ray or electron ray, a domain with a different contrast from the matrix is identified, and the identified domain is irradiated with laser beam.

(Supplementary Description 9)

Preferably, there is provided the method of the supplementary description 8, wherein in the perforating step, an image of the substrate is photographed using a camera, a domain with a different contrast from the matrix is identified by image recognition, and the identified domain is irradiated with laser beam.

(Supplementary Description 10)

Preferably, there is provided the method of any one of the supplementary descriptions 5 to 7, wherein in the perforating step, an image of the front surface of the substrate is photographed using a camera, the pit is identified by image recognition, and the identified pit is irradiated with laser beam.

(Supplementary Description 11)

Preferably, there is provided the method of any one of the supplementary descriptions 1 to 7, wherein in the perforating step, intermittent irradiation of laser beam is performed multiple number of times while shifting an irradiating position.

(Supplementary Description 12)

Preferably, there is provided the method of any one of the supplementary descriptions 1 to 7, wherein in the perforating step, continuous irradiation of laser beam is performed while shifting an irradiating position.

(Supplementary Description 13)

Preferably, there is provided the method of any one of the supplementary descriptions 1 to 12, wherein in the perforating step, a laser beam irradiating condition is controlled so that a minimum width of the through-hole as viewed from a front surface side of the substrate is set to 300 µm or less, preferably 200 µm or less.

(Supplementary Description 14)

Preferably, there is provided the method of any one of the supplementary descriptions 1 to 13, wherein in the perforating step, a laser beam irradiating condition is controlled so that a shape of the through-hole becomes a circular truncated cone shape in which an inner diameter is gradually increased from a front surface side of the substrate toward a back surface side thereof.

(Supplementary Description 15)

Preferably, there is provided the method of any one of the supplementary descriptions 1 to 13, wherein in the perforating step, a laser beam irradiating condition is controlled so that a shape of the through-hole becomes an inverted circular truncated cone shap in which an inner diameter is gradually decreased from a front surface side of the substrate toward a back surface side thereof.

(Supplementary Description 16)

Preferably, there is provided the method of any one of the supplementary descriptions 1 to 15, wherein in the perforating step, the laser beam irradiating condition is controlled so that a planar shape of the through-hole as viewed from the front surface side of the substrate becomes a rectangular shape having a short side and a long side, or a shape obtained by arbitrarily combining the rectangular shapes, and so that at least lengths of the short sides of each rectangular shape are set to 300 µm or less, preferably 200 µm or less.

(Supplementary Description 17)

Preferably, there is provided the method of any one of the supplementary descriptions 1 to 16, further including:

a cleaning step of removing at least one of foreign materials attached on an inner surface of the through-hole and a damage layer formed on the inner surface of the through-hole, by etching the inner surface of the through-hole, after performing the perforating step and before performing the embedding step.

(Supplementary Description 18)

Preferably, there is provided the method of any one of the supplementary descriptions 1 to 17, wherein in the embedding step, the front surface of the substrate is flattened by growing the group-III nitride crystal on at least a front surface side portion of the substrate in the through-hole.

(Supplementary Description 19)

Preferably, there is provided the method of any one of the supplementary descriptions 1 to 18, wherein in the embedding step, the front surface of the substrate is set as a surface on which a dislocation dense domain and a polarity inversion domain do not appear, by growing the group-III nitride crystal on at least the front surface side portion of the substrate in the through-hole.

(Supplementary Description 20)

Preferably, there is provided the method of any one of the supplementary descriptions 1 to 19, wherein in the embedding step, the group-III nitride crystal is grown in the through-hole using a vapor phase growth method.

(Supplementary Description 21)

Preferably, there is provided the method of any one of the supplementary descriptions 1 to 20, wherein the embedding step is performed in a state of holding the substrate on a supporting plate using the vapor phase growth method so as not to seal an opening which is one of two openings of the through-hole, and which is located on the back surface side opposed to the supporting plate.

(Supplementary Description 22)

Preferably, there is provided the method of any one of the supplementary descriptions 1 to 21, further including:

a fully-growing step of growing a crystal film made of the group-III nitride crystal on the group-III nitride substrate obtained by performing the embedding step; and a slicing step of cutting out one or more group-III nitride substrates from the crystal film.

(Supplementary Description 23)

Preferably, there is provided the method of any one of the supplementary descriptions 1 to 22, further including:

a fully-growing step of growing a crystal film made of the group-III nitride crystal on the group-III nitride substrate obtained by performing the embedding step, wherein in the embedding step and in the fully-growing step, crystal growth is respectively performed by a vapor phase growth method, and processing conditions are differentiated between the embedding step and the fully-growing step so that:

a crystal growth toward a creeping direction of the substrate in the embedding step becomes more active than a crystal growth toward a creeping direction of the substrate in the fully-growing step; and a crystal growth toward a main surface direction of the substrate in the fully-growing step becomes more active than a crystal growth toward a main surface direction of the substrate in the embedding step.

(Supplementary Description 24)

Preferably, there is provided the method of the supplementary description 23, wherein a ratio ($N_2/H_2$) of a partial pressure of $N_2$ gas to a partial pressure of $H_2$ gas in the fully-growing step is set to be smaller than a ratio ($N_2/H_2$) of a partial pressure of $N_2$ gas to a partial pressure of $H_2$ gas in the embedding step.

Supplementary Description 25

Preferably, there is provided the method of the supplementary description 23 or 24, wherein a processing temperature in the fully-growing step is lower than a processing temperature in the embedding step.

(Supplementary Description 26)

Preferably, there is provided the method of any one of the supplementary descriptions 23 to 25, wherein a flow rate ratio ($NH_3$/GaCl ratio) of a nitrogen-containing gas to a group-III source gas in the fully-growing step is larger than a flow rate ratio ($NH_3$/GaCl ratio) of a nitrogen-containing gas to a group-III source gas in the embedding step.

(Supplementary Description 27)

According to another aspect of the present disclosure, there is provided a group-III nitride substrate made of a group-III nitride crystal, which does not contain a dislocation dense domain and a polarity inversion domain, and which has a configuration (trace) in which a through-hole penetrating a substrate in a thickness direction is embedded with the group-III nitride crystal, on a back surface of the substrate.

(Supplementary Description 28)

Also preferably, there is provided the substrate of the supplementary description 27, wherein a minimum width of the through-hole as viewed from a front surface of the substrate is set to 300 µm or less.

What is claimed is:

1. A method for manufacturing a group-III nitride substrate, comprising:
   (a) preparing a substrate which is made of a group III-nitride crystal and which has a high oxygen concentration domain where an oxygen concentration is higher than that of a matrix of the crystal;
   (b) irradiating the substrate with laser beam aiming at the high oxygen concentration domain, forming a through-hole penetrating the substrate in a thickness direction, and removing at least a part of the high oxygen concentration domain from the substrate; and
   (c) epitaxially growing the same group-III nitride crystal as the group III-nitride crystal constituting the substrate in the through-hole, and embedding at least a front surface side opening of the through-hole with the group III-nitride crystal without gaps.

2. The method for manufacturing a group-III nitride substrate according to claim 1, wherein in the (b), irradiation of laser beam is performed aiming at a domain which is a part of the high oxygen concentration domain, and which includes a center of the high oxygen concentration domain.

3. The method for manufacturing a group-III nitride substrate according to claim 1, wherein in the (b), irradiation of laser beam is performed aiming at a domain which is a part of the high oxygen concentration domain, and which includes an intersection of diagonal lines of a polygonal shape which is either a hexagonal shape or a dodecagonal shape in planar view.

4. The method for manufacturing a group-III nitride substrate according to claim 1, wherein in the (b), either a dislocation dense domain or a polarity inversion domain in the oxygen high-concentration domain is removed from the substrate.

5. The method for manufacturing a group-III nitride substrate according to claim 1, wherein in the (b), a domain which is a part of the high oxygen concentration domain and which includes a dislocation dense domain or a polarity inversion domain, is removed from the substrate, and the other domain thereof is left on the substrate without being removed.

6. The method for manufacturing a group-III nitride substrate according to claim 1, wherein
   in the (a), a substrate in a as-grown state is prepared as the substrate, which is obtained by growing the group-III nitride crystal represented by a composition formula $Al_xIn_yGa_{1-x-y}N$ ($0 \leq x+y \leq 1$, $0 \leq x \leq 1$, $0 \leq y \leq 1$) so that its surface becomes (0001) plane, and
   in the (b), at least a part of the high oxygen concentration domain existing on a bottom surface side of a pit which observed on a front surface of the substrate, is removed from the substrate by irradiating the substrate with laser beam aiming at the pit to form the through-hole.

7. The method for manufacturing a group-III nitride substrate according to claim 1, wherein
   in the (a), as the substrate, a substrate is prepared so that a pit appears on a front surface of the substrate by polishing (0001) plane which is the front surface of the substrate made of the group-III nitride crystal represented by a composition formula $Al_xIn_yGa_{1-x-y}N$ ($0 \leq x+y \leq 1$, $0 \leq x \leq 1$, $0 \leq y \leq 1$), and thereafter etching the polished surface, and
   in the (b), at least a part of the high oxygen concentration domain existing on a bottom surface side of a pit which is observed on the front surface of the substrate, is removed from the substrate due to formation of the through-hole by irradiating the substrate with laser beam aiming at the pit.

8. The method for manufacturing a group-III nitride substrate according to claim 6, wherein in the (b), a domain which is a part of the high oxygen concentration domain and which includes at least a polarity inversion domain is removed from the substrate.

9. The method for manufacturing a group-III nitride substrate according to claim 6, wherein in the (b), a domain which is a part of the high oxygen concentration domain and which includes at least a polarity inversion domain is removed from the substrate, and the other domain thereof is left on the substrate without being removed.

10. The method for manufacturing a group-III nitride substrate according to claim 1, wherein in the (b), a light-emitting state of the crystal is observed when irradiating the substrate with ultraviolet ray or electron ray, a domain with a different contrast from the matrix is identified, and the identified domain is irradiated with laser beam.

11. The method for manufacturing a group-III nitride substrate according to claim 10, wherein in the (b), an image of the substrate is photographed using a camera, a domain with a different contrast from the matrix is identified by image recognition, and the identified domain is irradiated with laser beam.

12. The method for manufacturing a group-III nitride substrate according to claim 6, wherein in the (b), an image of the front surface of the substrate is photographed using a camera, the pit is identified by image recognition, and the identified pit is irradiated with laser beam.

13. The method for manufacturing a group-III nitride substrate according to claim 1, wherein in the (b), intermittently irradiation of laser beam is performed multiple number of times while shifting an irradiating position.

14. The method for manufacturing a group-III nitride substrate according to claim 1, wherein in the (b), continuous irradiation of laser beam is performed while shifting an irradiating position.

15. The method for manufacturing a group-III nitride substrate according to claim 1, wherein in the (b), a laser beam irradiating condition is controlled so that a minimum width of the through-hole as viewed from a front surface side of the substrate is set to 300 μm or less.

16. The method for manufacturing a group-III nitride substrate according to claim 1, wherein the (c) is performed in a state of holding the substrate on a supporting plate using a vapor phase growth method so as not to seal an opening which is one of two openings of the through-hole, and which is located on a back surface side opposed to the supporting plate.

17. The method for manufacturing a group-III nitiride substrate according to claim 1, further comprising:
   (d) growing a crystal film made of the group-III nitride crystal on the group-III nitride substrate obtained by performing the (c),
   wherein in the (c) and (d), crystal growth is respectively performed by a vapor phase growth method, and
   processing conditions are differentiated between the (c) and the (d) so that:
   a crystal growth toward a creeping direction of the substrate in the (c) becomes more active than a crystal growth toward a creeping direction of the substrate in the (d); and a crystal growth toward a main surface direction of the substrate in the (d) becomes more active than a crystal growth toward a main surface direction of the substrate in the (c).

18. A method for manufacturing a group-III nitride substrate, comprising:
   (a) preparing a substrate which is made of a group III-nitride crystal and which has a high oxygen concentration domain where an oxygen concentration is higher than that of a matrix of the crystal;
   (b) irradiating the substrate with laser beam aiming at the high oxygen concentration domain, forming a through-hole penetrating the substrate in a thickness direction, and removing at least a part of the high oxygen concentration domain from the substrate;
   (c) embedding at least a part of an inside of the through-hole by growing the group-III nitride crystal in the through-hole; and
   (d) growing a crystal film made of the group-III nitride crystal on a group-III nitride substrate obtained by performing (c),
   wherein in (c) and (d), crystal growth is respectively performed by a vapor phase growth method.

19. A method for manufacturing a group-III nitride substrate, comprising:
   (a) preparing a substrate which is made of a group III-nitride crystal and which has a high oxygen concentration domain where an oxygen concentration is higher than that of a matrix of the crystal;
   (b) irradiating the substrate with laser beam aiming at the high oxygen concentration domain, forming a through-hole penetrating the substrate in a thickness direction, and removing at least a part of the high oxygen concentration domain from the substrate;
   (c) embedding at least a part of an inside of the through-hole by growing the group-III nitride crystal in the through-hole; and
   (d) growing a crystal film made of the group-III nitride crystal on a group-III nitride substrate obtained by performing the (c),
   wherein in (c) and (d), crystal growth is respectively performed by a vapor phase growth method, and
   processing conditions are differentiated between (c) and (d) so that:
   a crystal growth toward a creeping direction of the substrate in (c) becomes more active than a crystal growth toward a creeping direction of the substrate in (d); and
   a crystal growth toward a main surface direction of the substrate in (d) becomes more active than a crystal growth toward a main surface direction of the substrate in (c).

* * * * *